United States Patent [19]

Takechi

[11] Patent Number: 4,994,935
[45] Date of Patent: Feb. 19, 1991

[54] SUPERCONDUCTING MAGNET APPARATUS WITH AN EMERGENCY RUN-DOWN SYSTEM

[75] Inventor: Moriaki Takechi, Ako, Japan

[73] Assignee: Mitsubishi Denki Kabushiki Kaisha, Japan

[21] Appl. No.: 542,703

[22] Filed: Jun. 13, 1990

[30] Foreign Application Priority Data

Jun. 15, 1989 [JP] Japan .................. 1-150567

[51] Int. Cl.$^5$ .............................................. H02H 9/00
[52] U.S. Cl. ...................... 361/141; 361/19; 505/1; 505/850
[58] Field of Search .............. 361/141, 19; 335/216; 307/245, 306; 324/320, 322; 200/289; 323/360; 505/1, 850

[56] References Cited

U.S. PATENT DOCUMENTS

| | | | |
|---|---|---|---|
| 4,559,576 | 12/1985 | Ries | 361/19 |
| 4,689,707 | 8/1987 | Schwall | 361/19 |
| 4,807,084 | 2/1989 | Takechi | 361/141 |

Primary Examiner—A. D. Pellinen
Assistant Examiner—Brian Johannssen
Attorney, Agent, or Firm—Leydig, Voit & Mayer

[57] ABSTRACT

A superconducting magnet apparatus comprising a superconducting main coil (1) for generating a uniform magnetic field and at least one superconducting shim coil (2a, 2b) electromagnetically coupled to the superconducting main coil (1) for increasing the uniformity of the magnetic field generated by the main coil (1). An emergency run down main coil heater element (21) is disposed adjacent to the main coil (1) for demagnetizing the latter, an emergency run down shim coil heater element (22a, 22b) is disposed in proximity of the shim coil (22a, 22b) for demagnetizing the latter, and a heater power source (24) is provided for supplying an electrical power to the heater elements (21,22a,22b). A switching unit (25,26,27) is connected between the heater elements (21,22a, 22b) and the heater power source (24) for connecting the heater power source (24) to the shim coil heater element (22a, 22b) and to the main coil heater element (21) at different time points with a predetermined time interval therebetween. The predetermined time interval may be selected such that the superconducting main coil (1) revert to a normal state after the superconducting shim coil (2a, 2b) has reverted to a normal state. The switching unit may include a first switch for selectively energizing the main coil heater element (21) and a second switch for selectively energizing the shim coil heater elements (22a, 22b) and a control unit for actuating the first and second switches at the different time points.

5 Claims, 4 Drawing Sheets

SUPERCONDUCTING MAGNET APPARATUS WITH AN EMERGENCY RUN-DOWN SYSTEM

BACKGROUND OF THE INVENTION

This invention relates to a superconducting magnet apparatus and, more particularly, to a superconducting magnet apparatus with an emergency run-down system for use in an nuclear magnetic resonance imaging system.

FIG. 1. is a circuit diagram illustrating one example of a conventional superconducting magnet apparatus which is provided with an emergency run-down system such as disclosed in U.S. Pat. No. 4,807,084. As illustrated, the superconducting magnet apparatus comprises a superconducting main coil 1 for generating a substantially uniform static magnetic field in a region subject to the magnetic resonance imaging. Also, a pair of superconducting shim coils 2a and 2b is electromagnetically coupled to the superconducting main coil 1 for increasing the uniformity of the magnetic field generated by said superconducting main coil 1.

The superconducting magnet apparatus also comprises persistent current switches 3, 4a and 4b connected in parallel to the superconducting main coil 1 and the superconducting shim coils 2a and 2b. The persistent current switch 3 comprise a persistent current switch superconductor 5 and a persistent current switch heater 7 disposed in proximity to the superconductor 5. Similarly, the persistent current switches 4a and 4b comprise superconductors 6a and 6b and 8b, respectively. The superconducting magnet apparatus also comprises protective elements 9,10a and 10b which are resistors or diodes connected in parallel to the respective coil 9, 10a and 10b. The protective elements 9, 10a and 10b are provided for supressing the voltage generated across the persistent current switches 3, 4a and 4b upon the occurence of quenching at the superconductor main coil 1 and the superconductor shim coils 2a and 2b.

An emergency run down main coil heater element 11 is disposed in proximity of the superconducting main coil 1 for demagnetizing the main coil 1, and similar emergency run down shim coil heater elements 12a and 12b are disposed in proximity of the superconducting shim coils 2a and 2b for demagnetizing the shim coils 2a and 2b. The components thus far described are enclosed within a cryogenic vessel 13. The main coil heater element 11 and the shim coil heater elements 12a and 12b are connected to a heater power source 14 through a switch 15. The heater elements 12a and 12b are connected in series to each other but are connected in parallel to the main coil heater element 11.

If it is desired to rapidly demagnetize the superconducting magnet apparatus during its operation in the persistent current mode for any reason such as when an iron piece is attracted to the superconducting magnet or breaking out of a fire, the heater switch 15 is closed to energize and heat the main coil heater element 11 as well as the shim coil heater elements 12a and 12b by the electric power from the heater power source 14 to heat the superconducting main coil 1 and the superconducting shim coils 2a and 2b. As the temperature of the main coil 1 and the shim coil 2a and 2b exceed the respective predetermined critical temperature, the coils 1, 2a and 2b revert from the superconducting state to the normal conduction state. Therefore, a current circulating through a closed circuit composed of the superconducting main coil 1 and the persistent current switch 3, a circulating current through a closed circuit composed of the superconducting shim coil 2a and the persistent current switch 4a and a circulating current through a sclosed circuit composed of the superconducting shim coil 2b and the persistent current switch 4b rapidly decrease, thereby demagnetizing the superconducting main coil 1 and the superconducting shim coils 2a and 2b.

However, the critical temperature, at which a superconducting coil revert from the superconducting state to the normal state, generally decreases as the magnetic field and the current flowing therethrough increase, and the superconducting main coil 1 generally has the critical temperature lower than that of the superconducting shim coil 2a or 2b. Therefore, when the demagnetizing heater elements 11, 12a and 12b are concurrently initiated to be energized, the superconducting main coil 1 which has the lower critical temperature is brought into the normal conduction state and demagnetized before the superconducting shim coils 2a and 2b are demagnetized in the normal state. During the rapid decreasing of the current in the superconducting main coil 1 when it is demagnetized, a large electoromotive force and therefore and excessively large current is induced in the superconducting shim coils 2a and 2b which are still in the superconducting state.

This large current induced in the superconducting shim coils 2a and 2b disadvantageously generates severe mechanical and thermal stresses on the superconducting shim coils 2a and 2b. Also, a large capacity protective element is required for protecting each superconducting shim coil against an excessive voltage across the shim coil.

SUMMARY OF THE INVENTION

Accordingly, one object of the present invention is to provide a superconducting magnet apparatus which is free from the above-discussed disadvantages of the conventional superconducting magnet apparatus.

Another object of the present invention is to provide a superconducting magnet apparatus in which no excessive current flows through the superconducting shim coils during the emergency running down.

Still another object of the present invention is to provide a superconducting magnet apparatus in which an emergency running down demagnetization of the superconducting main and shim coils can be quickly achieved without inducing an excessive current within the superconducting shim coils.

A futher object of the present invention is to provide a superconducting magnet apparatus in which large-capacity protective element is not necessary.

With the above objects in view, the superconducting magnet apparatus of the present invention comprises a superconducting main coil for generating a uniform magnetic field and a superconducting shim coil electromagnetically coupled to the superconducting main coil for increasing the uniformity of the magnetic field generated by the superconducting main coil. The apparatus also comprises an emergency run down main coil heater element disposed adjacent to the superconducting main coil for heating and demagnetizing the latter and an emergency run down shim coil heater element disposed in proximity of the superconducting shim coil for heating and demagnetizing the latter. An electrical power to the heater elements is supplied from a heater power source through a switching unit connected between the heater elements and the heater power source. The switching unit connects the heater power source to the superconducting shim coil heater element and to the superconducting main coil heater element at different time points with a predetermined time interval therebetween. The time interval being such that the superconducting main coil revert to a normal state only after the superconducting shim coil has reverted to a normal state.

The switching unit may be arranged to connect the superconducting main coil heater element to the power source after the superconductor shim coil has been reverted to a normal state. The switching unit may comprise a first switch for selectively energizing the superconducting main coil heater element and a second switch for selectively energizing the superconducting shim coil heater elements and a control unit for actuating the first and second switches at the different time points.

BRIEF DESCRIPTION OF THE DRAWINGS

The present invention will become more readily apparent from the following detailed description of the preferred embodiment of the present invention taken in conjunction with the accompanying drawings, in which.

DESCRIPTION OF THE PREFERRED EMBODIMENTS

Figure 1:
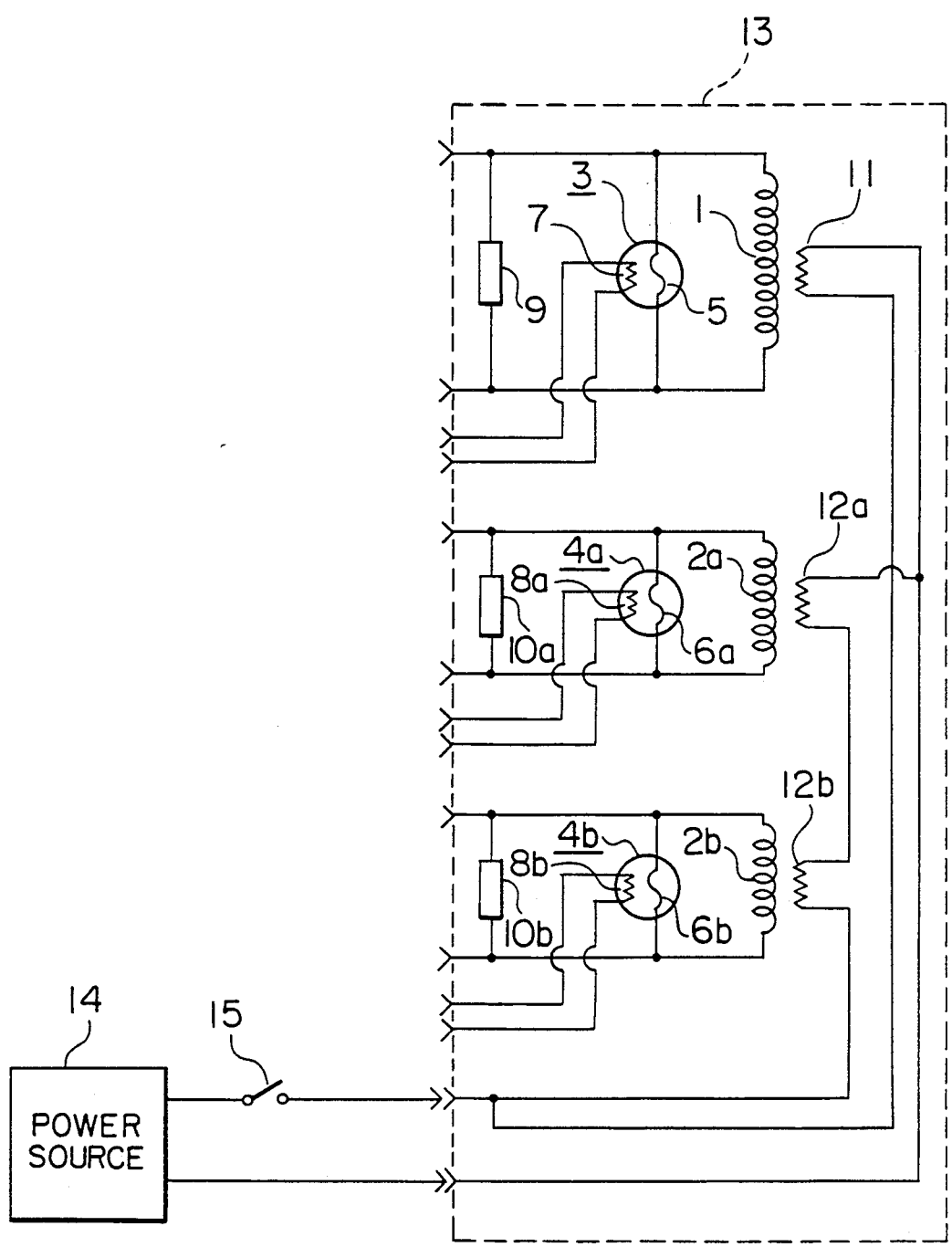
FIG. 1 is a circuit diagram of a conventional superconducting magnet apparatus with an emergency run-down system.
Figure 2:
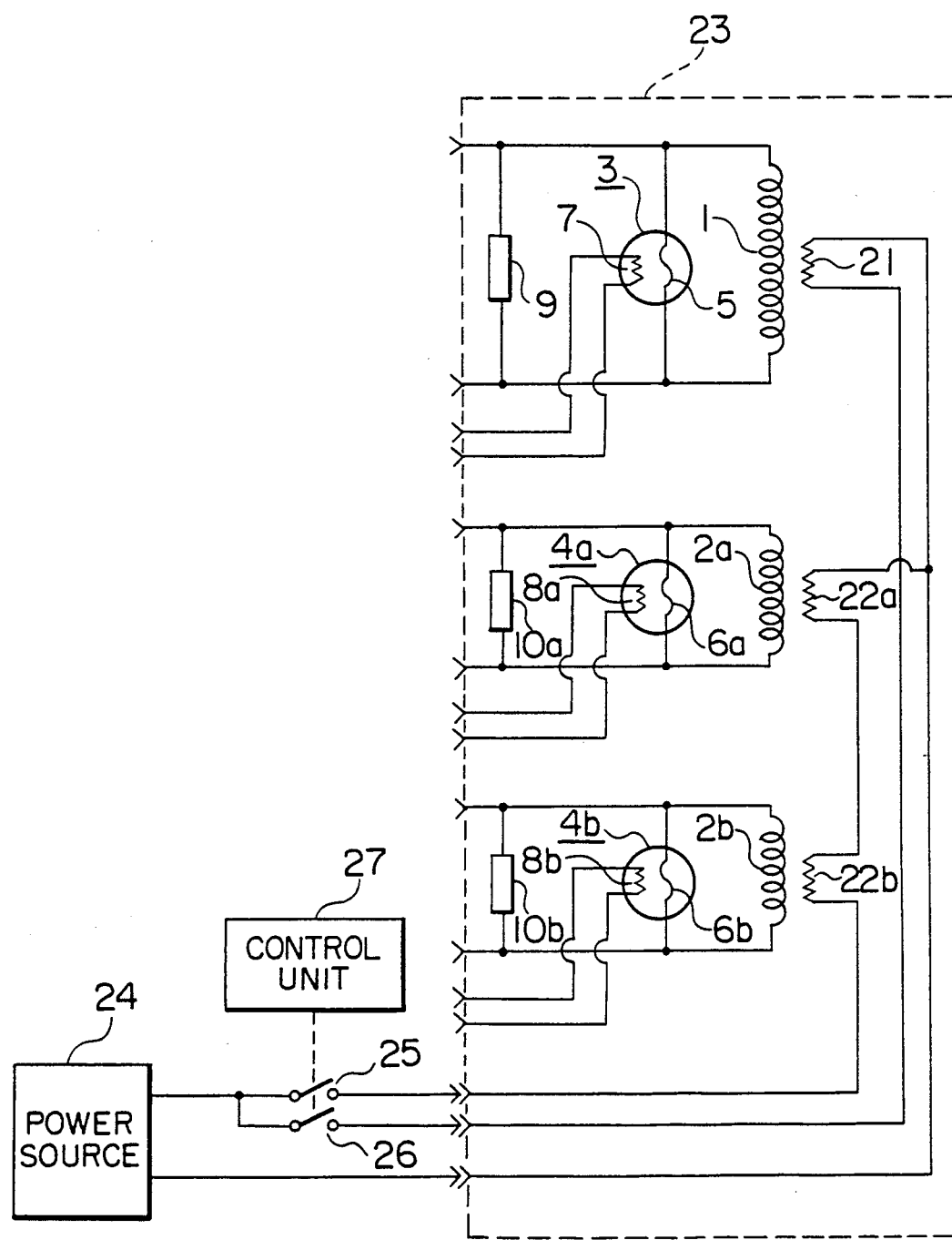
FIG. 2 is a circuit diagram of the superconducting magnet apparatus provided with an emergency run-down system constructed in accordance with the present invention.

FIG. 2 illustrates a superconducting magnet apparatus constructed in accordance with the present invention. The superconducting magnet apparatus comprises a superconducting main coil 1 for generating a substantially uniform static magnetic field in a region subject to the magnetic resonance imaging. Also, a pair of superconducting shim coils 2a and 2b is electromagnetically coupled to the superconducting main coil 1 for increasing the uniformity of the magnetic field generated by the superconducting main coil 1.

The superconducting magnet apparatus also comprises persistent current switches 3, 4a and 4b connected in parallel to the superconducting main coil 1 and the superconducting shim coils 2a and 2b, respectively. The persistent current switch 3 for the main coil 1 comprises a persistent current switch superconductor 5 and a persistent current switch heater 7 diposed in proximity to the superconductor 5. Similarly, the persistent current switches 4a and 4b for the shim coils 2a and 2b comprise superconductors 6a and 6b and heaters 8a and 8b, respectively. The superconducting magnet apparatus also comprises protective elements 9,10a and 10b which are resistors or diodes connected in parallel to the respective coils 9, 10a and 10b. The protective elements 9, 10a and 10b are provided for supressing the voltage generated across the persistent current switches 3, 4a and 4b upon the occurence of quenching at the superconductor main coil 1 and the superconductor shim coils 2a and 2b.

Figure 3:
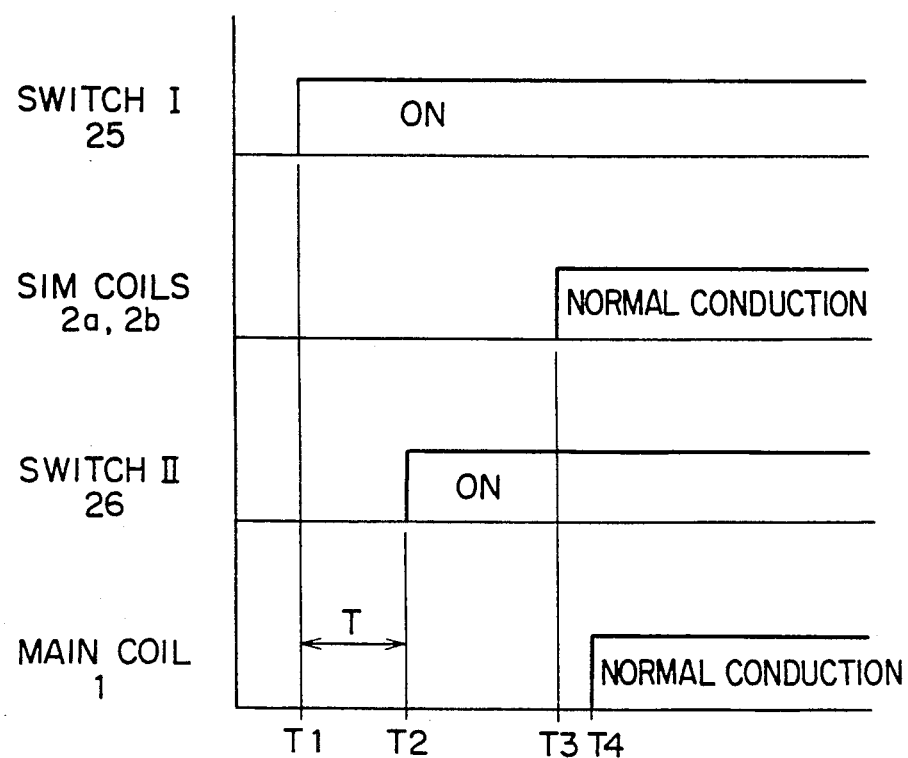
FIG. 3 is a graph for explaining the sequence of the operation of the heater switches illustrated in FIG. 2.

An emergency run down main coil heater element 21 is disposed in proximity of the superconducting main coil 1 for demagnetizing the main coil 1, and similar emergency run down shim coil heater elements 22a and 22b are disposed in proximity of the superconducting shim coils 2a and 2b for demagnetizing the shim coils 2a and 2b. The components thus far described are enclosed within a cryogenic vessel 23. The shim coil heater elements 22a and 22b are connected to a heater power source 24 through a first switch 25 and the main coil heater element 21 is connected to the heater power source 24 through a second switch 26. It is seen that the heater elements 22a and 22b are connected in series to each other but in parallel to the main coil heater element 21. Thus, the energization of the shim coil heater elements 22a and 22b is controlled by the first switch 25 and the energization of the main coil heater element 21 is controlled by the second switch 26. The first and the second switches 25 and 26 are connected to a control unit 27 so that their actuations are controlled by the control unit 27 in a manner illustrated in FIG. 3. The control unit 27 may be any suitable control unit which closes the first switch 25 to connect the heater power source 24 to the superconducting shim coil heater elements 22a and 22b at a first time point T1 and which closes the second switch 26 to connect the power source 24 to the superconducting main coil heater element 21 at a second time point T2 different from the first time point with a predetermined time interval T between the first and the second time points T1 and T2. This predetermined time interval T is determined such that the superconducting main coil 1 reverts to a normal state at a time point T4 only after the superconducting shim coil 2a and 2b have reverted to a normal state at a time point T3. The timing chart of this operations of the first and the second switches 25 and 26 in relation to the reversions of the main coil 1 and the shim coils 2a and 2b is illustrated in FIG. 3. Alternatively, the switching unit may be arranged to close the second switch 26 to energize the superconducting main coil heater element 21 to the power source 24 after the superconductor shim coils 22a and 22b have been reverted to their normal states.

If it is desired to rapidly demagnetize the superconducting magnet apparatus during its operation in the persistent current mode for any reason such as when an iron piece is magnetically attracted to the superconducting magnet or when a fire breaks out, the control unit 27 is manually or automatically activated. As illustrated in FIG. 3, the control unit 27 first closes the first switch 25 at the time point T1 to energize and heat the shim coil heater elements 22a and 22b by the electricl power from the heater power source 24 to initiate heating the superconducting shim coils 2a and 2b. As the temperature of the shim coils 2a and 2b exceeds the respective predetermined critical temperature, the shim coils 2a and 2b revert from the superconducting state to the normal conduction state at the time point T3.

In the illustrated embodiment, the second switch 26 for energizing the superconductor main coil heater element 21 is closed by the action of the control unit 27 at the time point T2 between the time points T1 and T3, i.e., after the closure of the first switch 25 and before the reversion of the second shim coils 2a and 2b into the normal state. The closure of the second switch 26 causes the main heater element 21 to be energized and heated to a predetermined critical temperature at a time point T4 after a lapse of a predetermined time after the closure of the switch 26. However, since it generally takes a shorter time (T2 ~T4) for the main coil heater element 21 to heat the superconducting main coil 1 than for the shim coil heater elements 22a and 22b to heat the superconducting shim coils 2a and 2b (T1 ~T3), the superconducting main coil 1 reach its critical temperature at T4 after the shim coils 2a and 2b reach their critical temperatures at T3 with only a relatively short interval (T3 ~T4) even when the main coil heater element 21 is energized at a relatively later time point than that of the shim coil heater elements 2a and 2b, whereby entire demagnetization or emergency running down can be quickly achieved.

Although an electric current is induced within the superconducting shim coils 22a and 22b when the superconducting main coil 1 is being demagnetized, the intensity of the induced current is limited by a resistance of the normal state shim coils 22a and 22b to a relatively small value that can be reasonably accomodated by the normal-state shim coils.

Also, while a current is induced in the superconducting main coil 1 during the currents flowing through the shim coils 2a and 2b are rapidly decreasing when the superconducting shim coils 2a and 2b are reverted to the normal state, this induced current in the main coil 1 is relatively small because the currents in the shim coils are small and the numbers of coil turns of the shim coils are small.

Figure 4:
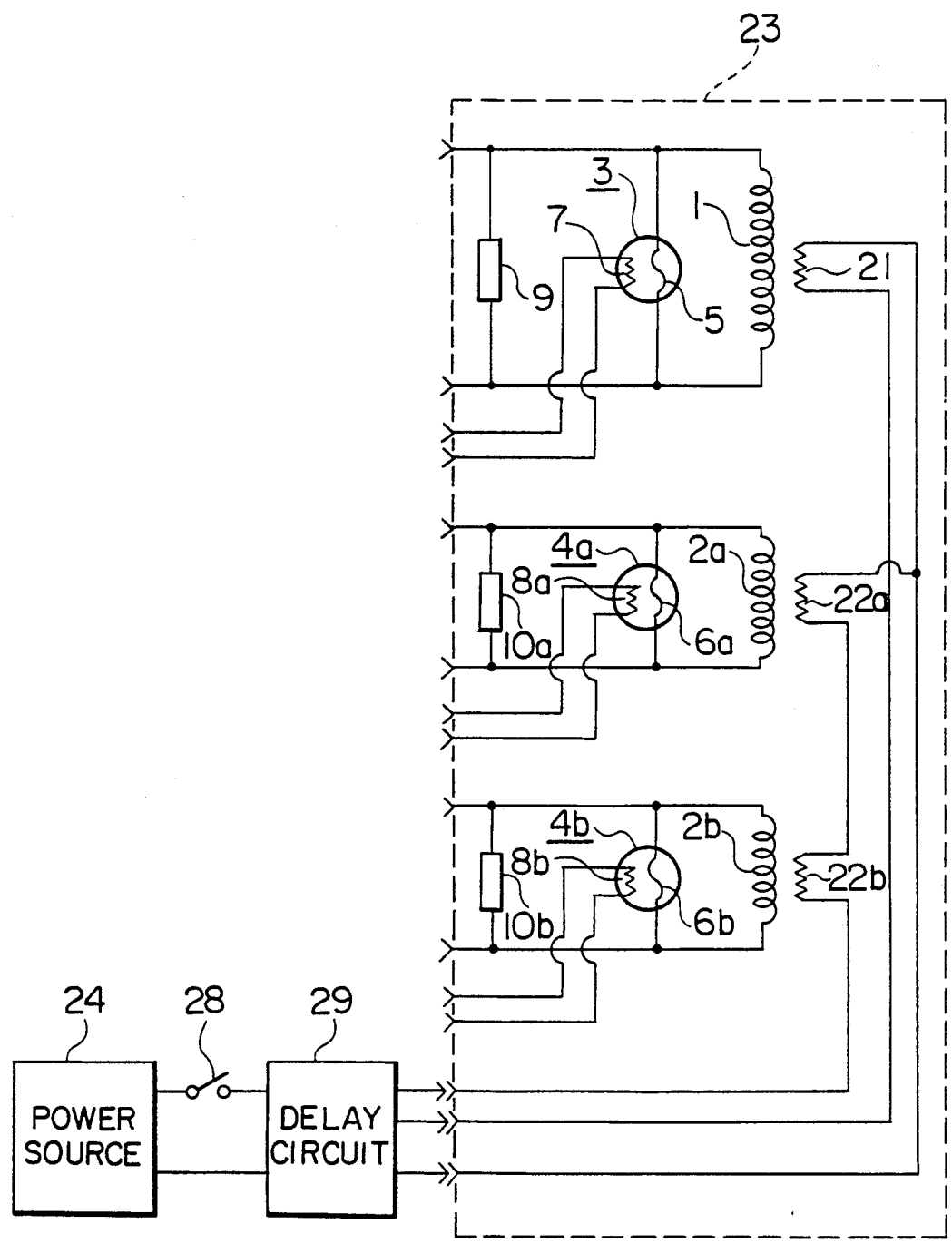
FIG. 4 is a circuit diagram of the superconducting magnet apparatus with an emergency run-down system of another embodiment of the present invention.

FIG. 4 illustrates another embodiment of the present invention in which a switch 28 and a delay circuit 29 are inserted between the heaters 21,22a and 22b and the power source 24. The function and operation of the switch 28 and the delay circuit 29 are the same as those of the first and the second switches 25 and 26 and the control unit 27 illustrated in FIG. 2.

It should be understood that the timing of the turning on and off of the heater switches 21, 22a and 22b may be be modified if it is desired to do so. For example, the control unit 27 may be set to close the second switch 26 which connects the superconducting main coil heater element 21 to the power source 24 after the superconductor shim coil 2a and 2b have been reverted to their normal states.

As has been described, the superconducting magnet apparatus of the present invention comprises an emergency run down main coil heater element disposed adjacent to a superconducting main coil for heating and demagnetizing the latter and an emergency run down shim coil heater element disposed in proxomity of a superconducting shim coil for heating and demagnetizing the latter. An electrical power to the heater elements is supplied from a heater power source through a switching unit connected between the heater elements and the heater power source.The switching unit connects the heater power source to the superconducting shim coil heater element and to the superconducting main coil heater element at different time points with a predetermined time interval therebetween. The time interval being such that the superconducting main coil revert to a normal state only after the superconducting shim coil has reverted to a normal state.

Accordingly, the superconducting magnet apparatus of the present invention has no excessive current flowing through the superconducting shim coils during the emergency running down . Also, the emergency running down demagnetization of the superconducting main and shim coils can be quickly achieved without inducing and excessive current within the superconducting shim coils. Further, a large-capacity protective element is not necessary.

What is claimed is:

1. A superconducting magnet apparatus comprising:
    a superconducting main coil for generating a uniform magnetic field;
    a superconducting shim coil electromagnetically coupled to said superconducting main coil for increasing the uniformity of said magnetic field generated by said superconducting main coil;
    an emergency run down main coil heater element disposed adjacent to said superconducting main coil for demagnetizing the latter;
    an emergency run down shim coil heater element disposed in proximity of said superconducting shim coil for demagnetizing the latter;
    a heater power source for supplying an electrical power to said heater elements; and
    switching means, connected between said heater elements and said heater power source, for connecting said heater power source to said superconducting shim coil heater element and to said superconducting main coil heater element at different time points with a predetermined time interval therebetween, said predetermined time interval being such that said superconducting main coil revert to a normal state after said superconducting shim coil has reverted to a normal state.

2. A superconducting magnet apparatus as claimed in claim 1, wherein said switching means is arranged to connect said superconducting main coil heater element to said power source after said superconductor shim coil has been reverted to a normal state.

3. A superconducting magnet apparatus as claimed in claim 1, wherein said switching means comprises a first switch for selectively energizing said superconducting main coil heater element and a second switch for selectively energizing said superconducting shim coil heater elements and a control unit for actuating said first and second switches at said different time points.

4. An emergency demagnetizing method for a superconducting magnet apparatus comprising a superconducting main coil for generating a uniform magnetic field, a superconducting shim coil electromagnetically coupled to said superconducting main coil, an emergency run down main coil heater element for demagnetizing it, and an emergency run down shim coil heater element for demagnetizing it,
    said method comprising the steps of:
    energizing said shim coil heater element at a first time point;
    energizing said main coil heater element at a second time point different from said first time point by a predetermined time interval, said predetermined time interval being such that said superconducting main coil revert to a normal state after said superconducting shim coil has reverted to a normal state.

5. An emergency demagnetizing method for a superconducting magnet apparatus as claimed in claim 4, wherein said predetermined time interval being such that said superconducting main coil heater element is energized after said superconductor shim coil has been reverted to a normal state.

* * * * *

UNITED STATES PATENT AND TRADEMARK OFFICE
CERTIFICATE OF CORRECTION

PATENT NO. : 4,994,935
DATED : February 19, 1991
INVENTOR(S) : Moriaki Takechi

It is certified that error appears in the above-identified patent and that said Letters Patent is hereby corrected as shown below:

Column 6, line 29, change "revert" to --reverts--;
" line 59, change "revert" to --reverts--.

Signed and Sealed this

Twenty-first Day of July, 1992

Attest:

DOUGLAS B. COMER

Attesting Officer     Acting Commissioner of Patents and Trademarks